US007039883B2

United States Patent
Krishnamurthy

(10) Patent No.: US 7,039,883 B2
(45) Date of Patent: May 2, 2006

(54) DERIVATION OF CIRCUIT BLOCK CONSTRAINTS

(75) Inventor: Narayanan Krishnamurthy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 300 days.

(21) Appl. No.: 10/728,622

(22) Filed: Dec. 5, 2003

(65) Prior Publication Data

US 2005/0125757 A1  Jun. 9, 2005

(51) Int. Cl.
*G06F 17/50* (2006.01)
*G06F 9/45* (2006.01)

(52) U.S. Cl. .................. 716/3; 716/4; 716/7; 703/13
(58) Field of Classification Search ................ None
See application file for complete search history.

(56) References Cited

U.S. PATENT DOCUMENTS

| | | | | |
|---|---|---|---|---|
| 6,301,687 | B1 * | 10/2001 | Jain et al. ................. | 716/3 |
| 6,378,112 | B1 * | 4/2002 | Martin et al. .............. | 716/5 |
| 6,792,581 | B1 * | 9/2004 | Moondanos et al. ........ | 716/4 |
| 6,931,611 | B1 * | 8/2005 | Martin et al. .............. | 716/5 |

OTHER PUBLICATIONS

Chen et al., "Parallel Construction Algorithms for BDDs," Proc. 1999 IEEE Int'l Symposium on Circuits & Systems, pp. 318-322.*
Wang et al., "Automatic Generation of Assertions for Formal Verification of PowerPC Microprocessor Arrays Using Symbolic Trajectory Evaluation," 1998 ACM Design Automation Conference, pp. 534-537.*
Yeh et al., "Variable ordering for ordered binary decision diagrams by a divide-and-conquer approach," IEE Proc.-Comput. Digit. Tech., vol. 144, No. 5, Sep. 1997, pp. 261-266.*
Zeng et al., "A Fault Partitioning Method in Parallel Test Generation for Large Scale VLSI Circuits," 1999 $8^{th}$ Asian Test Symposium, pp. 133-137.*

(Continued)

*Primary Examiner*—Leigh M. Garbowski
(74) *Attorney, Agent, or Firm*—David G. Dolezal; Michael P. Noonan

(57) ABSTRACT

A design tool for generating circuit block constraints from a design environment. The design tool derives a fan-in cone function for each block input of a circuit block of a design. The fan-in cone function may include fan-in cone variables and block input variables. The fan-in cone functions are conjoined into a circuit block constraint functions. The circuit block constraint function is quantified to provide circuit block constraints. These constraints may be used in design verification (e.g. equivalence checking) and/or circuit analysis (e.g. timing rule generation).

35 Claims, 3 Drawing Sheets

OTHER PUBLICATIONS

Burch et al., "Sequential Circuit Verification Using Symbolic Model Checking," *27th ACM/IEEE Design Automation Conference*, 1990, Paper 3.2, pp. 46-51.

Cabodi et al., "Symbolic FMS Traversals Based on the Transition Relation," *IEEE Transactions on Computer-Aided Design of Integrated Circuits and Systems*, vol. 16, No. 5, May 1997, pp. 448-457.

Touati et al., "Implicit State Enumeration of Finite State Machines using BDD's," *IEEE ICCAD*, Nov. 1990, pp. 130-133.

* cited by examiner

DERIVATION OF CIRCUIT BLOCK CONSTRAINTS

BACKGROUND OF THE INVENTION

1. Field of the Invention

This invention relates in general to integrated circuit design.

2. Description of the Related Art

In the design of integrated circuits, models such as e.g. Register Transfer Language (RTL) models are written by logic designers for describing the functionality of design blocks. The sub-component RTL models are integrated into a complete RTL model of an integrated circuit that is simulated to establish correct functionality. The RTL models serve as specifications for refining each sub-component of the design into transistor level circuit models—be it synthesized or custom designed. Once the RTL model and circuit implementation (e.g. transistor level circuit model) of a sub-component are available, the RTL model is proved equivalent to the circuit implementation using standard equivalence checking technology. This equivalence checking may be necessary for all sub-components that make up the integrated circuit because the RTL model and its simulation semantics may be required to be predictive of silicon behavior.

Ideally, equivalence checking between the RTL model and the circuit implementation of sub-components should be achievable even when no assumptions are made on the sub-component primary inputs i.e., they are left completely non-deterministic. In most cases, this is not possible as the logic and/or underlying circuit implementation of the sub-components are designed to work correctly only under a restricted environment. Therefore, assumptions that constrain the behavior of a sub-components primary inputs are necessary in order to establish equivalence between each sub-component RTL and the corresponding circuit implementation. This implies that the circuit implementation is equivalent to the RTL model only for a subset of the reachable state space, i.e. the circuit's environment must satisfy the assumptions made during equivalence checking.

In a typical design verification flow, there are a number of user constraints that have been used in the subcomponent's equivalence checking flow. User constraints are assumptions about the environment of the block under test that a user (designer) specifies. These constraints can be treated as assertions that must be satisfied in the context of the full integrated circuit environment. These assertions may be expressed as Boolean conditions that must always hold during all modes of operation of the integrated circuit. A methodology to check the correctness of these assertions and to ensure the absence of over-constraining is important for finding bugs due to incorrect/over-constrained equivalence checking at the sub-component level.

One often-used method of assertion checking is to write simulation monitors to monitor assertion violations every simulation cycle using directed test suites and functional test vectors. The problem with such a method lies in the difficulty in generating directed test vectors, and their inherent incompleteness from the point of view of coverage. The simulation sequence used may not "hit" the bug, which may then go undetected. Also, simulation monitors usually have an adverse effect on simulation performance.

What is needed is an improved technique for integrated circuit design.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

It has been discovered that a technique that extracts a set of constraints from a design's environment may provide for an improved process for integrated circuit design.

Figure 1:
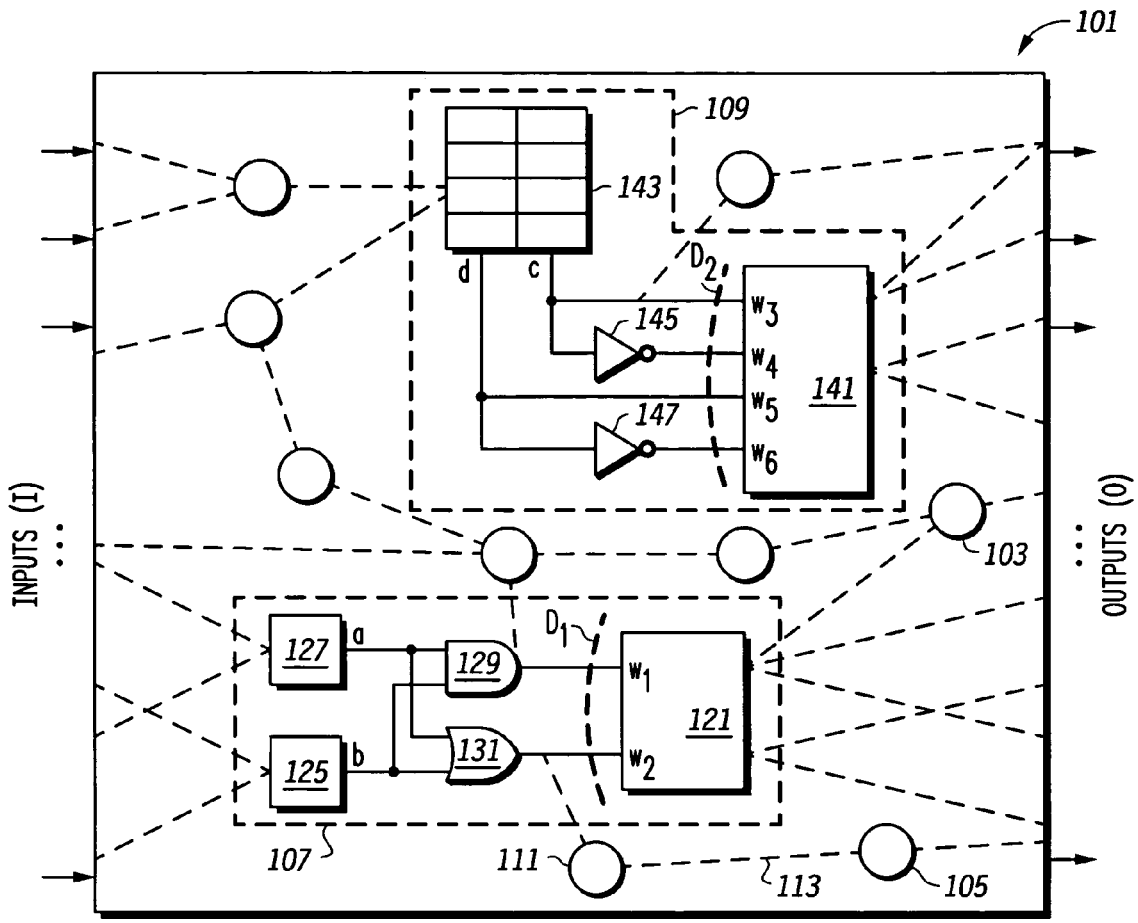
FIG. 1 represents one embodiment of a design of an integrated circuit according to the present invention.

FIG. 1 represents one embodiment of a design of an integrated circuit according to the present invention. In the embodiment shown, design 101 is a gate level design. The circles (e.g. 105, 111) in FIG. 1 represent design sub-components (circuit blocks) of integrated circuit 101. Blocks 107 and 109 represent blocks whose circuitry have been shown in greater detail in FIG. 1 for illustration purposes. It is understood that each circle in FIG. 1 represents circuitry of integrated circuit 101 that is not shown in the detail of blocks 107 and 109 for the simplification of FIG. 1.

Block 107 includes a circuit block 121 having circuit block inputs $w_1$ and $w_2$ that are connected to an AND gate 129 and an OR gate 131, respectively. The inputs of AND gate 129 and OR gate 131 are connected to latches 127 and 125.

Block 109 includes circuit block 141. Block 141 has inputs $w_3$, $w_4$, $w_5$, and $w_6$. Input $w_4$ is connected to inverter 145 and input $w_6$ is connected to inverter 147. The inputs of block 141 are coupled to the outputs d and c of memory 143. In other embodiments, other circuit blocks may have inputs coupled to primary inputs or other state holding elements (e.g. memories) of an integrated circuit.

Also shown in FIG. 1 are design cuts $D_1$ and $D_2$. Design cuts $D_1$ and $D_2$ are used to derive circuit block auto constraints for block 121 and block 141, respectively. A design cut is an arbitrary set of nodes in a circuit. For example, inputs $w_1$ and $w_2$ are the nodes of cut $D_1$ and inputs $w_3$, $w_4$, $w_5$, and $w_6$ are nodes for cut $D_2$. Auto constraints are differentiated from circuit block user constraints in that they are automatically generated from e.g. a design environment.

Figure 2:
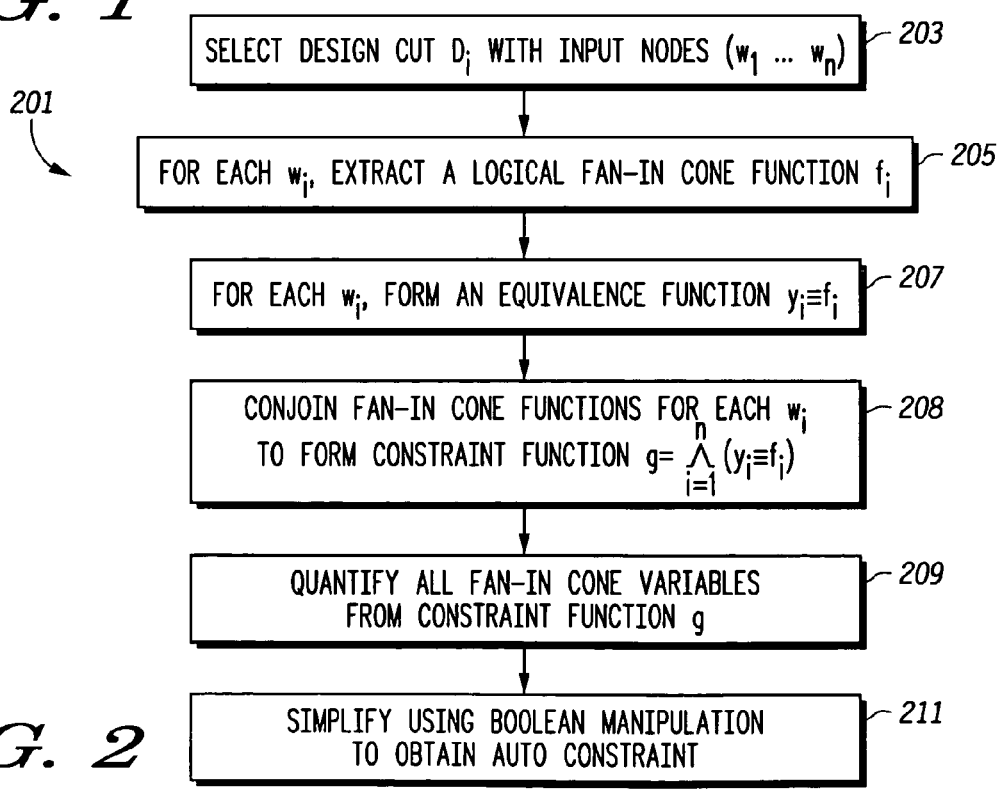
FIG. 2 is a flow diagram of one embodiment of generating auto constraints of circuit blocks of an integrated circuit design according to the present invention.

FIG. 2 is a flow diagram for one embodiment of generating auto constraints of a circuit block of an integrated circuit design. In one embodiment, the method of FIG. 2 is performed using a computer aided design tool capable of performing a variety of circuit design tool functions such as functional simulation, timing analysis, and equivalence testing.

In 203, the design tool selects design cut $D_i$ of a circuit block of a design (D) and identifies its associated input nodes ($w_1 \ldots w_n$). In one embodiment, the circuit block was selected from the design by the design tool. In other embodiments, the circuit block may be selected by a user. In one embodiment, the design cut is selected according to the natural (predefined) design partitioning of a circuit which is performed as part of the design flow activity. For the example of block 107 of integrated circuit 101, cut $D_1$ is selected with input nodes $w_1$ and $w_2$.

In 205, the design tool extracts a logical fan-in cone function ($f_i$) for each input node $w_i$ of the design cut $D_i$. A logical fan-in cone function ($f_i$) is a logical function representative of a fan-in cone that drives the state of the input ($w_i$). The logical fan-in cone functions are expressed as a function of fan-in cone variables. For cut $D_1$ of FIG. 1, the logical fan-in cone function for input $w_1$ would be $f_1 = a \wedge b$ and the logical fan-in cone function for input $w_2$ would be $f_2 = a \vee b$, with a and b being fan-in cone variables. In one embodiment, the design tool extracts the logical fan-in cone functions by backtracing each circuit branch coupled to an input node to a predetermined cone stop node (e.g. a primary input, a latch output, a memory output, and an intermediate circuit node if such a node is common to at least two fan-in cones of a block).

In 207, block input Boolean variables ($y_i$) are introduced for each input $w_i$ to form a fan-in-cone function in equivalence form for each input. Boolean variables are variables whose values range over the set {0,1}. For the example of cut $D_1$, a design tool would form fan-in cone functions $y1 \equiv f1$ and $y2 \equiv f2$, wherein $\equiv$ is an equivalence sign.

In 208, the fan-in cone functions of equivalence form for the design cut $D_i$ are conjoined to form a circuit block constraint function:

$$g = \bigwedge_{i=1}^{N} (y_i \equiv f_i)$$

where N is the number of input nodes in the design cut. For design cut $D_1$, the constraint function is $g = (y1 \equiv a \wedge b) \wedge (y2 \equiv a \vee b)$.

In 209, the design tool quantifies the fan-in cone variables (e.g. a and b for the embodiment of design cut $D_1$) in the circuit block constraint function (g) to remove the fan-in cone variables so that the circuit block constraint function depends upon block input Boolean variables (e.g. $y_1$ and $y_2$ for the embodiment of design cut $D_1$). In one embodiment, this quantification is performed according to rules of Boolean algebra derivation. In one embodiment, this quantification is performed using existential operators. In some embodiments, this quantification may utilize quantification optimizations such as partitioning, clustering, and co-factoring techniques. In one type of quantification optimization, a first instance of a circuit block constraint function (g) is generated with a value (e.g. 0) substituted for a fan-in cone variable (e.g. a), and a second instance of the constraint function is generated with a complementary value (e.g. 1) substituted for the fan-in cone variable, wherein the two instances are ORed. For the embodiment of design cut $D_1$, the resultant circuit block constraint function g with the fan-in cone variables removed is $g = \sim y_1 \vee y_2$, which represent an auto constraint for design cut $D_1$.

The auto constraint $g = \sim y_1 \vee y_2$ can be represented by the form $g = y_1 \Rightarrow y_2$. This auto constraint represents that if $y_1$ is a logical one, then $y_2$ must be a logical one as well. Accordingly, any simulation of circuit block 121 does not need to evaluate the case for $y_1 = 1$ and $y_2 = 0$ according to the auto constraint derived above.

For the embodiment shown above, the constraint function g was formed by conjoining fan-in cone functions of equivalence form. However, in other embodiments, logically equivalent fan-in cone functions of other forms may be conjoined such as logically equivalent fan-in functions having an exclusive NOR form.

The flow set forth in FIG. 2 may be modified to incorporate initial state restrictions in the generation of the auto constraints. In one embodiment, these initial state restrictions are incorporated by conjoining the initial state restrictions with the constraint function.

For example, referring back to FIG. 1, circuit block 141 includes inputs $w_3$, $w_4$, $w_5$, and $w_6$, coupled to a memory 143. Inputs $w_3$, $w_4$, $w_5$, and $w_6$ serve as input nodes for cut $D_2$. Assumptions may be made as to the initial state of the memory. One example of such an assumption is "Every row of the memory has at least one '1'". This initial state restriction can be captured by the Boolean function $S_{init} = c \vee d$. This initial state restriction is conjoined in the constraint function for cut D2 (e.g. formed in 208) as:

$$g = \left( \bigwedge_{i=1}^{N} (y_i \equiv f_i) \right) \wedge S_{init}$$

Operations 208 and 209 may then be performed using the above equation to obtain auto constraints for circuit 141.

In some embodiments, the state spaces of a memory may be abstracted to reduce computation overhead of auto constraint generation. For example, memory 143 is a two column by four row array which may store any one of 256($2^8$) possible combinations. However, because each of these combinations include outputs c and d being at either a 0 or 1, the memory state space may be abstracted to a total of four possible outputs (00, 01, 10, and 11) during auto constraint generation. In other embodiments, the state spaces of other memories of other dimensions may be abstracted to its outputs. Abstracting the state spaces may reduce computation overhead by reducing state explosion of the memory output.

In other embodiments, other auto constraints may be generated for other circuit blocks having a different number of inputs.

Figure 3:
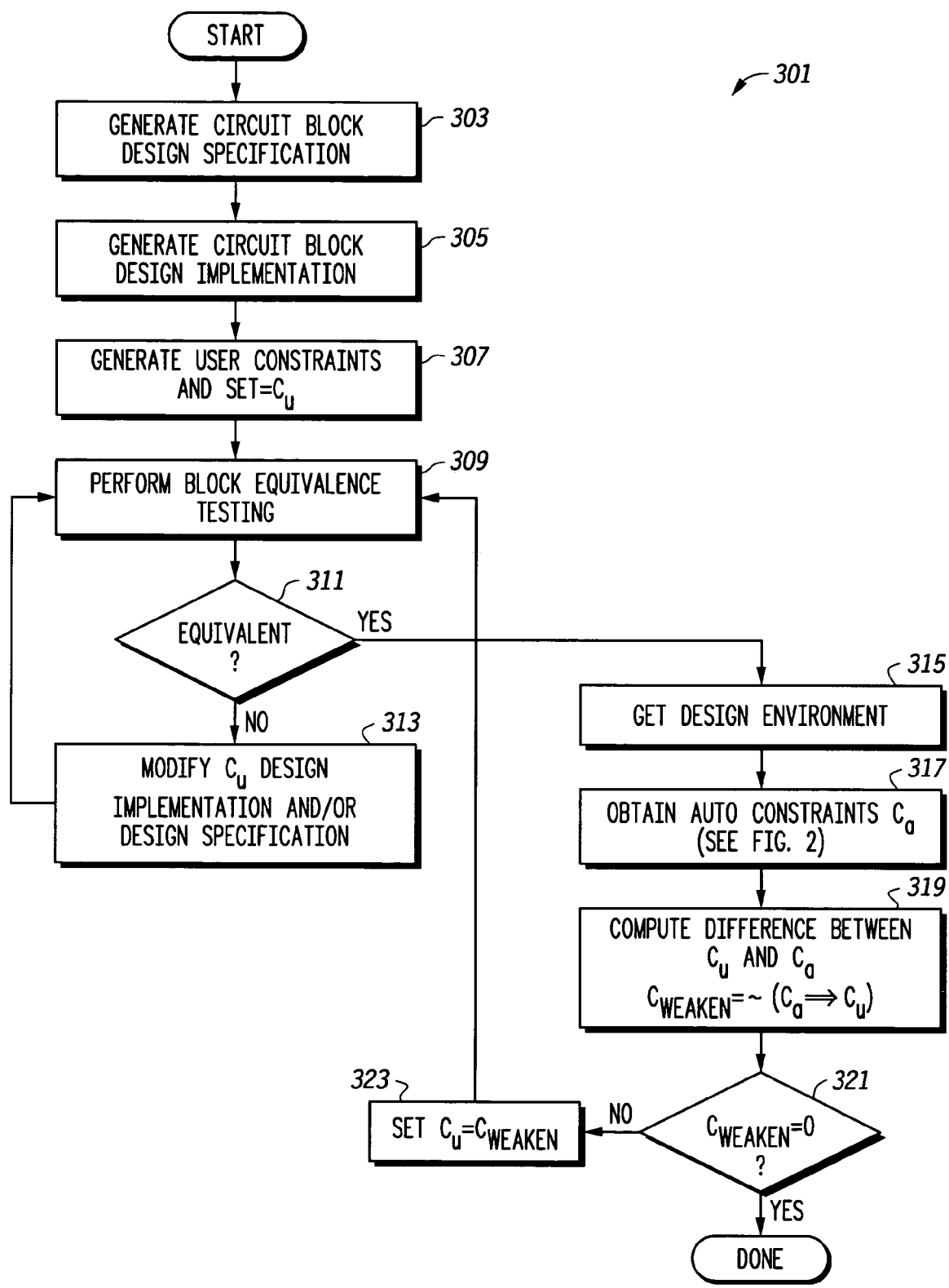
FIG. 3 represents a flow diagram of one embodiment for designing an integrated circuit according to the present invention.

FIG. 3 represents a flow diagram of one embodiment for designing an integrated circuit according to the present invention. In 303, a design specification for a circuit block is generated. This design specification may be a gate level design, a logic level design, or an RTL design of a circuit block. In 305 a circuit block design implementation of the design specification is generated. In one embodiment, the circuit block design implementation is a transistor level circuit design. However, in other embodiments, the design implementation may be of another lower level design type than that of the design specification. The design implementation may be user generated (custom generated) or synthesized from the design specification by the design tool. In some embodiments, operation 305 may be synthesized during a process that synthesizes the design implementation for the entire integrated circuit from the design specification of the entire integrated circuit.

In 307, a user enters user constraints to define the environment of the circuit block. These user constraints are constraints set forth by the user that hold true for the operation of the circuit block. In 307, the user constrains are set to $C_u$. In 309, block equivalence testing of the design implementation and design specification is performed to determine if the design implementation satisfies the design specification. If there is no equivalence between the design implementation and the design specification, in 313, the user constraints, the design implementation, and/or the design specification may be modified until equivalence between the design specification and design implementation is achieved.

Once equivalence is achieved, in 315, the design environment is obtained. The design environment represents the surrounding circuitry of the circuit block coupled to the input nodes of the circuit block. In 317, auto constraints ($C_a$) of the circuit block are obtained e.g. as by the method set forth in FIG. 2. The auto constraints may be obtained from the design specification and/or the design implementation.

In 319, a weakening factor ($C_{weaken}$) is obtained by computing the difference between $C_u$ and auto constraints ($C_a$) as shown by the equation $C_{weaken}=\sim(C_a=>C_u)$.

In 321, if $C_u$ is different than $C_a$, then $C_u$ is set to the difference $C_{weaken}$ wherein the equivalence testing is performed again (e.g. 311) for the difference. Because $C_{weaken}$ represents a set of input conditions that were not tested because they were eliminated due to $C_u$ being overly restrictive, retesting is performed on those input conditions. A constraint is considered "weaker" than another constraint if its considered less restrictive (allows more behaviors). Retesting is performed until $C_u$ equals $C_a$ or is weaker than $C_a$ ($C_a$ is more restrictive) as designated by $C_{weaken}=0$ in 321. In one embodiment, the equivalence testing should be performed accounting for all behaviors of the weakest constraints. Accordingly, if $C_u$ is weaker than $C_a$, no additional equivalence testing is required. In other embodiments, retesting may be performed with $C_u=C_a$. In other embodiments, equivalence retesting is performed with the auto constraints ($C_a$) instead of the difference.

In some embodiments, the design tool generates assertions for use in functional simulation of the design specification from the auto constraints. Assertions are simulation monitors used for checking whether the design specification satisfies certain properties. An example of an assertion is "one_hot (a, b)." This means that a and b are complimentary. During simulation, the property set forth by this assertion is monitored, wherein an error is generated if the property is violated.

Figure 4:
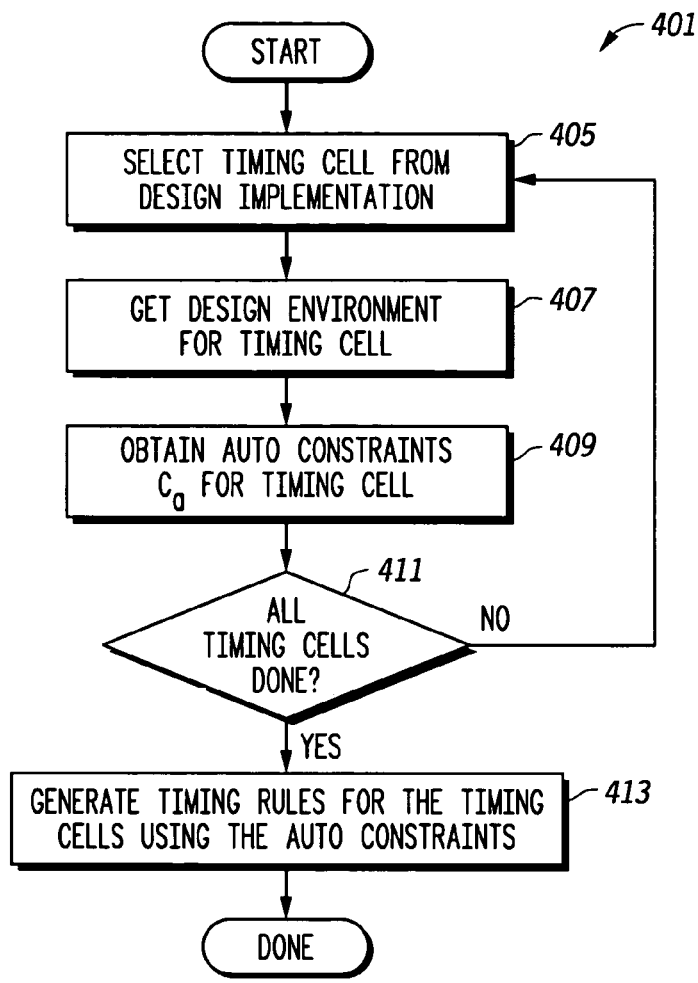
FIG. 4 represents a flow diagram of another embodiment for designing an integrated circuit according to the present invention.

FIG. 4 represents a flow diagram of another embodiment for designing an integrated circuit according to the present invention. The flow of FIG. 4 shows a process for generating auto constraints for the generation of timing rules. In one embodiment, a timing rule for a circuit block is a characterization of a timing path from an input to an output of a circuit block. A timing cell includes at least one channel connected subcomponent of the block. An example of a timing rule is that the maximum rise time from an input to an output is a certain amount of time.

In 405, a timing cell of a circuit block of the design implementation is selected. In one embodiment, operation 405 is performed by the design tool, but may be user performed in other embodiments. In 407, the design tool obtains the design environment for the timing cell. In 409, the design tool obtains the auto constraints $C_a$ for the timing cell e.g. as per the flow set forth in FIG. 2. After the auto constraints are generated for all timing cells of a circuit block (as determined in 411), then the timing rules for the circuit block are generated using the auto constraints in 413.

One difference between the flow of FIG. 3 and the flow of FIG. 4 is that in FIG. 4, no user constraints are used in the generation of the timing rules. However, in other embodiments, user constraints may be utilized in the generation of timing rules. Furthermore, in a modification of FIG. 3, auto constraints are first generated (e.g. 315 and 317) from the design implementation and then used in place of $C_u$ in operation 307. In such an embodiment, no user constraints would be used in equivalence testing.

Preferably, in some embodiments of integrated circuit design, user-constraints should be identical to or weaker than the auto constraints used during the equivalence checking flow. In some embodiments, auto constraints may eliminate the need for the manual codification of user constraints. However, in some industrial settings, the environment of the sub-component design may not be known until later in the design cycle. Also, it may be the case that there are many possible environments for the sub-component. The non-deterministic nature of the environments for a sub-component design may call for a correct-by-construction methodology for constraints. Also, some embodiments may provide for the absence of over-constraining in equivalence checking flows by considering both the environment in which the design component is embedded and the design component itself. This, in some embodiments, may provide for the elimination of false positives due to incorrect constraints assumed during the equivalence checking flow.

Figure 5:
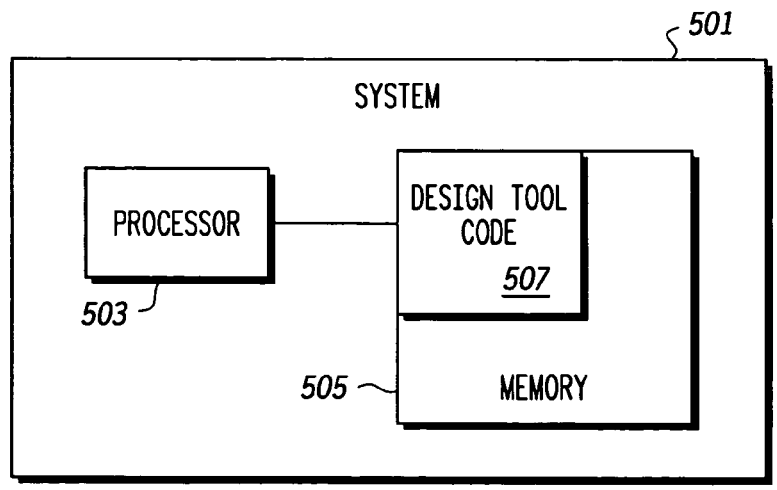
FIG. 5 is a block diagram of one embodiment of a system for implementing a design tool according to the present invention.

FIG. 5 is a block diagram of one embodiment of a system for implementing a design tool according to the present invention. System 501 includes a processor 503 for executing design tool code 507 stored in memory 505. Design tool code 507 includes instructions for performing the design tool functions. In one embodiment, system 501 includes user interface devices (not shown) for inputting user data (e.g. user constraints). In one embodiment, code 507 includes instructions for performing the design tool operations set forth in FIGS. 2, 3, and 4, and/or other design tool operations described in the specification above. Other systems may have other configurations. For example, in some embodiments, some of the design tool operations may be performed by more than one system or different design tool operations may be performed by different systems. Thus, in some of these systems, the instructions for implementing a design tool may be stored in different computer readable medium.

In one aspect of the invention, a computer aided method of designing a circuit includes selecting a circuit block of the circuit. The circuit block having a plurality of block inputs. The method includes deriving a fan-in cone function for each block input of the plurality. Each fan-in cone function comprising a corresponding block input variable expressed as a function of at least one fan-in cone variable. The method further includes conjoining the fan-in cone functions for each block input into a circuit block constraint function and quantifying the circuit block constraint function to provide at least one circuit block constraint as a function of block input variables.

In another aspect, the invention includes an apparatus comprising at least one computer aided design tool implemented by the execution of code on at least one computer readable medium. The code comprises instructions for deriving a fan-in cone function for each block input of a plurality of inputs of a circuit block. Each fan-in cone function comprises a corresponding block input variable expressed as a function of at least one fan-in cone variable.

The code also includes instructions for conjoining the fan-in cone functions for each block input of the plurality into a circuit block constraint function and instructions for quantifying the circuit block constraint function to provide at least one circuit block constraint as a function of block input variables.

In another aspect, an apparatus for designing a circuit includes means for deriving a fan-in cone function for each block input of a plurality of block inputs of a circuit block. Each fan-in cone function comprises a corresponding block input variable expressed as a function of at least one fan-in cone variable. The apparatus also includes means for conjoining the fan-in cone functions for each block input into a circuit block constraint function and means for quantifying the circuit block constraint function to provide at least one circuit block constraint as a function of block input variables.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A computer aided method of designing a circuit comprising:
    selecting a circuit block of the circuit, the circuit block having a plurality of block inputs;
    deriving a fan-in cone function for each block input of the plurality, each fan-in cone function comprising a corresponding block input variable expressed as a function of at least one fan-in cone variable;
    conjoining the fan-in cone functions for each block input into a circuit block constraint function; and
    quantifying the circuit block constraint function to provide at least one circuit block constraint as a function of block input variables.

2. The method of claim 1 wherein the selecting the circuit block comprises one of:
    selecting the circuit block by a user; and
    selecting the circuit block by a design tool along pre-defined circuit design partitions.

3. The method of claim 1 wherein the deriving a fan-in cone function for each block input of the plurality comprises:
    selecting a block input; and
    backtracing each circuit branch from the selected block input to a node of a type corresponding to a cone stop node.

4. The method of claim 3 wherein the cone stop node is at least one of the group consisting of a latch output, a primary circuit input, a memory output, and an intermediate circuit node if such intermediate circuit node is common to a plurality of fan-in cones corresponding to the selected circuit block.

5. The method of claim 1 wherein the deriving a fan-in cone function for each block input of the plurality comprises:
    defining each block input variable to be equivalent to a logical function of fan-in cone variables of a fan-in cone corresponding to the block input variable, the logical function depending on circuitry in a backtraced circuit branch.

6. The method of claim 1 wherein the conjoining the fan-in cone functions for each block input into a circuit block constraint function comprises defining the circuit block constraint function to be equal to the fan-in cone functions ANDed together.

7. The method of claim 1 wherein the quantifying the circuit block constraint function comprises:
    selecting a fan-in cone variable of the circuit block constraint function;
    generating a first instance of the circuit block constraint function with a value substituted for the selected fan-in cone variable;
    generating a second instance of the circuit block constraint function with a complement value substituted for the selected fan-in cone variable; and
    ORing the first instance and the second instance.

8. The method of claim 1 wherein the quantifying further comprises:
    simplifying the circuit block constraint function using Boolean algebraic derivation to provide the circuit block constraints wherein relations between one or more of the block input variables are provided.

9. The method of claim 1 further comprising:
    computing a difference between the at least one circuit block constraint and at least one circuit block user constraint.

10. The method of claim 9 further comprising:
    performing equivalence testing on the circuit block using the difference.

11. The method of claim 1 further comprising conjoining an initial state restriction into the circuit block constraint function.

12. The method of claim 1 further comprising:
    selecting another circuit block of the circuit, the another circuit block having a second plurality of block inputs;
    deriving a fan-in cone function for each block input of the second plurality, each fan-in cone function comprising a corresponding block input variable expressed as a function of at least one fan-in cone variable;
    conjoining the fan-in cone functions for each block input of the second plurality into a second circuit block constraint function; and
    quantifying the second circuit block constraint function to provide at least one circuit block constraint as a function of block input variables.

13. The method of claim 1 further comprising:
    automatically converting the at least one circuit block constraint to an assertion; and
    using the assertion during a functional simulation of the circuit block.

14. The method of claim 1 wherein the fan-in cone function for each block input has an equivalence form.

15. The method of claim 1 wherein the circuit block is one of a design specification or a design implementation.

16. The method of claim 1 further comprising:
    generating a design specification of the circuit block;
    generating a design implementation of the circuit block;
    performing equivalence testing of the design implementation and design specification to determine if the design implementation satisfies the design specification.

17. The method of claim 16 wherein the performing equivalence testing is performed accounting for at least some behaviors of the at least one circuit block constraint.

18. The method of claim 17 wherein the performing equivalence testing is performed accounting for all of the behaviors of the at least one circuit block constraint.

19. The method of claim 1 wherein the circuit block constraints of the at least one circuit block constraint are characterized as auto constraints.

20. An apparatus comprising at least one computer aided design tool implemented by the execution of code on at least one computer readable medium, the code comprising:
   instructions for deriving a fan-in cone function for each block input of a plurality of inputs of a circuit block, each fan-in cone function comprising a corresponding block input variable expressed as a function of at least one fan-in cone variable;
   instructions for conjoining the fan-in cone functions for each block input of the plurality into a circuit block constraint function; and
   instructions for quantifying the circuit block constraint function to provide at least one circuit block constraint as a function of block input variables.

21. The apparatus of claim 20 wherein the code further comprises:
   instructions for computing a difference between the at least one circuit block constraint and at least one circuit block user constraint.

22. The apparatus of claim 21, wherein the code further comprises:
   instructions for performing equivalence testing of the circuit block using the difference.

23. The apparatus of claim 20, wherein the code further comprises:
   instructions for performing equivalence testing of the circuit block using the at least one circuit block constraint.

24. The apparatus of claim 20, wherein the code further comprises:
   instructions for converting the at least one circuit block constraint to an at least one assertion;
   instructions for using the at least one assertion during functional simulation of the circuit block.

25. The apparatus of claim 20 wherein the code further comprises:
   instructions for selecting the circuit block from a circuit design.

26. The apparatus of claim 20 wherein the code further comprises:
   instructions for conjoining an initial state restriction into the circuit block constraint function.

27. An apparatus for designing a circuit comprising:
   means for deriving a fan-in cone function for each block input of a plurality of block inputs of a circuit block, each fan-in cone function comprising a corresponding block input variable expressed as a function of at least one fan-in cone variable;
   means for conjoining the fan-in cone functions for each block input into a circuit block constraint function; and
   means for quantifying the circuit block constraint function to provide at least one circuit block constraint as a function of block input variables.

28. The apparatus of claim 27 wherein the means for conjoining further comprises:
   means for conjoining an initial state restriction into the circuit block constraint function.

29. The apparatus of claim 27 wherein the means for deriving a fan-in cone function further comprises:
   means for backtracing each circuit branch of a selected block input of the plurality to a stop node, the stop node being at least one of a latch output, a primary circuit input, a memory output, and an intermediate circuit node if such intermediate circuit node is common to a plurality of fan-in cones corresponding to the circuit block.

30. The apparatus of claim 27 wherein the means for deriving the fan-in cone function further comprises:
   means for defining each block input variable for each block input of the plurality to be equivalent to a logical function of fan-in cone variables corresponding to the block input variable, the logical function depending on circuitry in a backtraced circuit branch.

31. The apparatus of claim 27 further comprising:
   means for computing a difference between the at least one circuit block constraint and an at least one circuit block user constraint.

32. The apparatus of claim 31 further comprising:
   means for performing equivalence testing on the circuit block using the difference.

33. The apparatus of claim 27 further comprising:
   means for performing equivalence testing on the circuit block using the at least one circuit block constraint.

34. The apparatus of claim 27 further comprising:
   means for automatically converting the at least one circuit block constraint to at least one assertion; and
   means for using the at least one assertion during functional simulation of the circuit block.

35. The apparatus of claim 27 further comprising:
   means for selecting the circuit block from a circuit.

* * * * *